(12) United States Patent
Ng (10) Patent No.: US 11,411,394 B2
(45) Date of Patent: Aug. 9, 2022

(54) VOLTAGE CLAMPING CIRCUIT FOR PROTECTING AN INTERNAL CIRCUITRY AND A METHOD OF OPERATING THEREOF

(71) Applicant: SKYECHIP SDN BHD, Pulau Pinang (MY)

(72) Inventor: Hoong Chin Ng, Pulau Pinang (MY)

(73) Assignee: SKYECHIP SDN BHD, Bayan Lepas (MY)

( * ) Notice: Subject to any disclaimer, the term of this patent is extended or adjusted under 35 U.S.C. 154(b) by 0 days.

(21) Appl. No.: 17/206,415

(22) Filed: Mar. 19, 2021

(65) Prior Publication Data
US 2022/0209528 A1 Jun. 30, 2022

(30) Foreign Application Priority Data
Dec. 31, 2020 (MY) .............................. PI2020007203

(51) Int. Cl.
*H02H 9/04* (2006.01)
(52) U.S. Cl.
CPC ...................................... *H02H 9/04* (2013.01)
(58) Field of Classification Search
CPC ........................................................ H02H 9/04

USPC ............................................................ 361/56
See application file for complete search history.

(56) References Cited

U.S. PATENT DOCUMENTS

| | | |
|---|---|---|
| 5,528,190 A | 6/1996 | Honnigford |
| 9,571,075 B1 * | 2/2017 | Ng ........................... H03K 5/08 |

* cited by examiner

*Primary Examiner* — Dharti H Patel
(74) *Attorney, Agent, or Firm* — Aslan Law, P.C.

(57) ABSTRACT

A voltage clamping circuit for protecting an internal circuitry comprising an input means for receiving Vin; a p-channel clamping transistor (PCT) coupled to input means for clamping Vin to prevent Vin from falling below a p-channel biasing voltage VbiasP; an n-channel clamping transistor (NCT) coupled to input means for clamping Vin to prevent Vin from rising above an n-channel biasing voltage VbiasN; and a plurality of output means for providing a first output voltage from PCT and a second output voltage from NCT; a p-channel bias circuit including a first, a second and a third bias transistor with each transistor possessing a threshold voltage Vth for providing a p-channel bias voltage to turn on PCT; and an n-channel bias circuit including a fourth, a fifth and a sixth bias transistor with each transistor possessing the threshold voltage Vth for providing an n-channel bias voltage to turn on NCT.

4 Claims, 6 Drawing Sheets

VOLTAGE CLAMPING CIRCUIT FOR PROTECTING AN INTERNAL CIRCUITRY AND A METHOD OF OPERATING THEREOF

CROSS-REFERENCE TO RELATED APPLICATIONS

This application claims priority to MY Patent Application No. PI2020007203 filed on Dec. 31, 2020, the entire contents of which are hereby incorporated by reference.

TECHNICAL FIELD

The present invention relates generally to a voltage clamping circuit for protecting an internal circuitry. More particularly, the present invention relates to a voltage clamping circuit with signal splitting and dynamic bias capabilities. The present invention also relates to a method of operating the voltage clamping circuit.

BACKGROUND ART

In the field of semiconductor technology, continued research and development are conducted to build next generation devices that are smaller and faster. As technology nodes of integrated circuits continue to shrink, the maximum nominal operating voltage that can be handled by input/output (I/O) transistors becomes smaller. For instance, the maximum nominal operating voltage of a new I/O transistor can be restricted to only 1.8 V. Nevertheless, input signals that are supplied to the I/O pads can reflect voltage values of up to 3 V or even more for supporting older legacy interface standards. In order to protect the internal circuitry from electrical overstress, it is desirable to employ clamping devices to limit or clip the input voltage to corresponding receivers in the integrated circuits. It is vital to have a reliable rail-to-rail input voltage so as to prevent damage to the integrated circuits.

Numerous efforts have been made to suppress adverse effects caused by the out-of-limit input voltage to protect the delicate electrical circuits. Some of the efforts are discussed in the following references.

US09571075B1 discloses an integrated circuit with input voltage clamping circuitry for receiving an input signal from external devices. The input voltage clamping circuitry may include a voltage splitting and clamping circuit, a selectively enabled transmission gate circuit, and a digitization and clamping circuit. The voltage splitting and clamping circuit may be configured to split the input signal into at least two separate components each of which is limited to a predetermined voltage swing. The transmission gate circuit may be selectively enabled to provide full rail signalling when the input signal has a power supply level that is below a predefined threshold. The digitization and clamping circuit may include a Schmitt trigger translation for converting the split signal components to a digitized signal that is clamped down to the predefined threshold.

U.S. Pat. No. 5,528,190A discloses a voltage clamping circuit for clamping the input voltage to CMOS devices near the rail voltages so as to prevent forward biased junctions, minority carrier injection and crosstalk between voltage inputs. The voltage clamping circuit receives an input voltage and provides an output voltage within a rail-to-rail voltage range. The clamping circuit has a bias circuit with a PMOS device for providing a p-channel threshold drop to an upper rail voltage so as to generate an upper threshold bias voltage. The bias circuit also has an NMOS device for providing an n-channel threshold increase to a lower rail voltage so as to generate a lower threshold bias voltage. A first clamping transistor is coupled to the input for clamping the input voltage so as to prevent the input voltage from rising above the upper rail voltage. A second clamping transistor is coupled to the input for clamping the input voltage so as to prevent the input voltage from dropping below the lower rail voltage. Gain stages control the clamping transistors in response to the upper and lower threshold bias voltages and the input voltage so as to cause the clamping transistors to clamp the input voltage.

The aforementioned references may strive to provide improved input voltage clamp devices. Nevertheless, they still have a number of limitations and shortcomings. For example, the input voltage clamp devices in the aforementioned references usually prompt signal attenuation and distortion due to reduced passing voltage range. Loss of a substantial portion of the input voltage will severely impact the performance of the integrated circuits. Furthermore, none of the input voltage clamp devices in the aforementioned references are capable of eliminating high-impedance state for voltage clamp outputs.

Accordingly, there remains a need to have a voltage clamping circuit which overcomes the aforesaid problems and shortcomings.

SUMMARY OF THE INVENTION

The following presents a simplified summary of the invention in order to provide a basic understanding of some aspects of the invention. This summary is not an extensive overview of the invention. Its sole purpose is to present some concepts of the invention in a simplified form as a prelude to the more detailed description that is presented later.

It is an objective of the present invention to provide a voltage clamping circuit which can protect an internal circuitry from electrical overstress.

It is also an objective of the present invention to provide a voltage clamping circuit which is capable of reducing signal attenuation and distortion through maximizing the passing voltage range.

It is yet another objective of the present invention to provide a voltage clamping circuit which can eliminate the high-impedance state for the voltage clamp outputs.

It is also an objective of the present invention to provide a method of operating a voltage clamping circuit.

Accordingly, these objectives may be achieved by following the teachings of the present invention. The present invention relates to a voltage clamping circuit for protecting an internal circuitry comprising an input means for receiving an input voltage Vin, a p-channel clamping transistor coupled to the input means for clamping the input voltage to prevent the input voltage from falling below a p-channel biasing voltage VbiasP, an n-channel clamping transistor coupled to the input means for clamping the input voltage to prevent the input voltage from rising above an n-channel biasing voltage VbiasN, and a plurality of output means for providing a first output voltage from the p-channel clamping transistor and a second output voltage from the n-channel clamping transistor. The voltage clamping circuit is characterized by a p-channel bias circuit including a first bias transistor, a second bias transistor and a third bias transistor with each transistor possessing a threshold voltage Vth for providing a p-channel bias voltage to turn on the p-channel clamping transistor; and an n-channel bias circuit including a fourth bias transistor, a fifth bias transistor and a sixth bias transistor with each transistor possessing the threshold voltage Vth for providing an n-channel bias voltage to turn on the n-channel clamping transistor; wherein the first bias transistor is connected to a p-channel biasing line associated with the p-channel biasing voltage VbiasP, the second bias transistor and the third bias transistor are connected in series and to the input means; wherein the fourth bias transistor is connected to an n-channel biasing line associated with the n-channel biasing voltage VbiasN, the fifth bias transistor and the sixth bias transistor are connected in series and to the input means.

Further, the present invention relates to a method for operating the voltage clamping circuit, characterized by the steps of receiving the input voltage Vin, generating the p-channel bias voltage, generating the n-channel bias voltage, controlling the p-channel clamping transistor based on the input voltage and the p-channel bias voltage, controlling the n-channel clamping transistor based on the input voltage and the n-channel bias voltage, turning on the p-channel clamping transistor when the input voltage Vin rises above the p-channel biasing voltage VbiasP, turning on the n-channel clamping transistor when the input voltage Vin falls below the n-channel biasing voltage VbiasN, and providing the first output voltage from the p-channel clamping transistor and the second output voltage from the n-channel clamping transistor.

The foregoing and other objects, features, aspects and advantages of the present invention will become better understood from a careful reading of a detailed description provided herein below with appropriate reference to the accompanying drawings.

BRIEF DESCRIPTION OF THE DRAWINGS

So that the manner in which the above recited features of the present invention can be understood in detail, a more particular description of the invention, briefly summarized above, may have been referred by embodiments, some of which are illustrated in the appended drawings. It is to be noted, however, that the appended drawings illustrate only typical embodiments of this invention and are therefore not to be considered limiting of its scope, for the invention may admit to other equally effective embodiments.

These and other features, benefits, and advantages of the present invention will become apparent by reference to the following text figures, with like reference numbers referring to like structures across the views, wherein.

DETAILED DESCRIPTION OF THE INVENTION

As required, detailed embodiments of the present invention are disclosed herein; however, it is to be understood that the disclosed embodiments are merely exemplary of the invention, which may be embodied in various forms. Therefore, specific structural and functional details disclosed herein are not to be interpreted as limiting but merely as a basis for claims. It should be understood that the drawings and detailed description thereto are not intended to limit the invention to the particular form disclosed, but on the contrary, the invention is to cover all modifications, equivalents and alternatives falling within the scope of the present invention as defined by the appended claims. As used throughout this application, the word "may" is used in a permissive sense (i.e., meaning having the potential to), rather than the mandatory sense (i.e., meaning must). Similarly, the words "include," "including," and "includes" mean including, but not limited to. Further, the words "a" or "an" mean "at least one" and the word "plurality" means one or more, unless otherwise mentioned. Where the abbreviations or technical terms are used, these indicate the commonly accepted meanings as known in the technical field.

The present invention is described hereinafter by various embodiments with reference to the accompanying drawings, wherein reference numerals used in the accompanying drawings correspond to the like elements throughout the description. This invention may, however, be embodied in many different forms and should not be construed as limited to the embodiment set forth herein. Rather, the embodiment is provided so that this disclosure will be thorough and complete and will fully convey the scope of the invention to those skilled in the art. In the following detailed description, numeric values and ranges are provided for various aspects of the implementations described. These values and ranges are to be treated as examples only, and are not intended to limit the scope of the claims. In addition, a number of materials are identified as suitable for various facets of the implementations. These materials are to be treated as exemplary, and are not intended to limit the scope of the invention.

Figure 1:
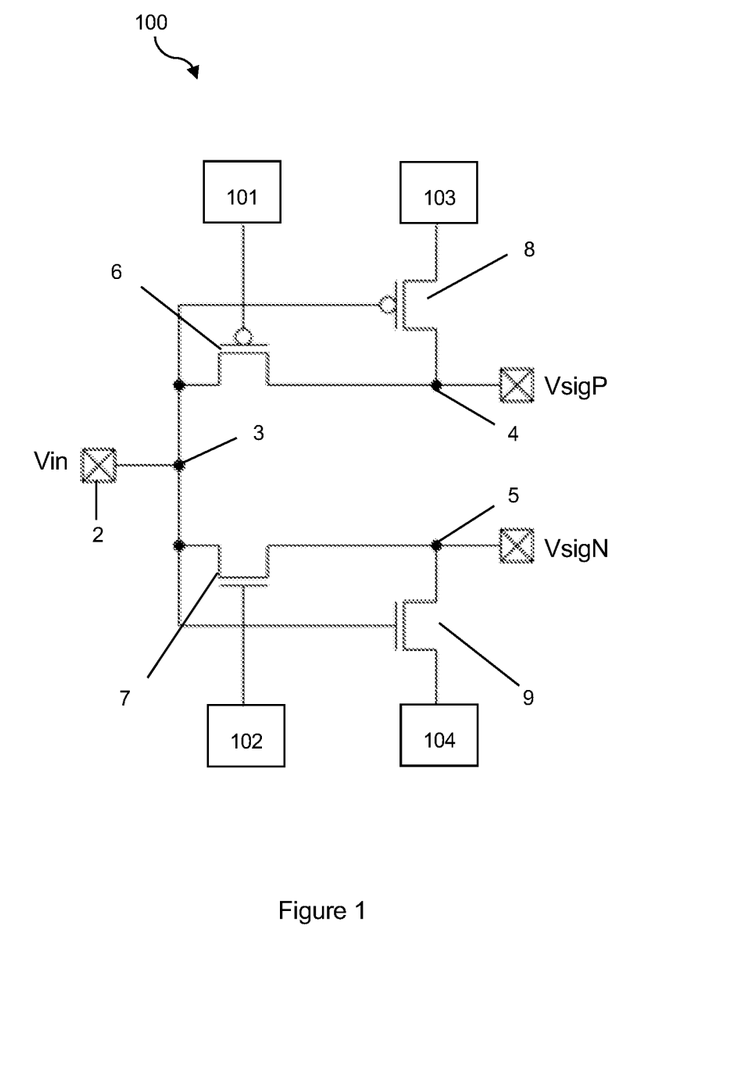
FIG. 1 illustrates a voltage clamping circuit in accordance with an embodiment of the present invention.

FIG. 1 illustrates a voltage clamping circuit (100) in accordance with an embodiment of the present invention. The voltage clamping circuit (100) comprises an input means (3) which is intended to receive an input voltage Vin from an input/output (I/O) pad (2), a p-channel clamping transistor (6), an n-channel clamping transistor (7), a p-channel keeping transistor (8), an n-channel keeping transistor (9) and a plurality of output means comprising a first output node (4) where a first output voltage VsigP is generated and a second output node (5) where a second output voltage VsigN is generated. The first output node (4) can be connected to a first receiver pad and the second output node (5) can be connected to a second receiver pad. The p-channel clamping transistor (6) and the p-channel keeping transistor (9) can serve as p-type metal-oxide-semiconductor (PMOS) transistors while the n-channel clamping transistor (7) and the n-channel keeping transistor (8) can serve as n-type metal-oxide-semiconductor (NMOS) transistors.

In accordance with the voltage clamping circuit (100) as shown in FIG. 1, a first source-drain terminal of the p-channel clamping transistor (6) can be coupled to the first output node (4). A second source-drain terminal of the p-channel clamping transistor (6) can be coupled to the input means (3). A gate terminal of the p-channel clamping transistor (6) can be connected to a p-channel bias circuit (101) as shown in FIG. 2 for receiving a p-channel bias voltage.

Similarly, a first source-drain terminal of the n-channel clamping transistor (7) can be coupled to the second output node (5). A second source-drain terminal of the n-channel clamping transistor (7) can be coupled to the input means (3). A gate terminal of the n-channel clamping transistor (7) can be connected to an n-channel bias circuit (102) as shown in FIG. 3 for receiving an n-channel bias voltage.

Figure 2:
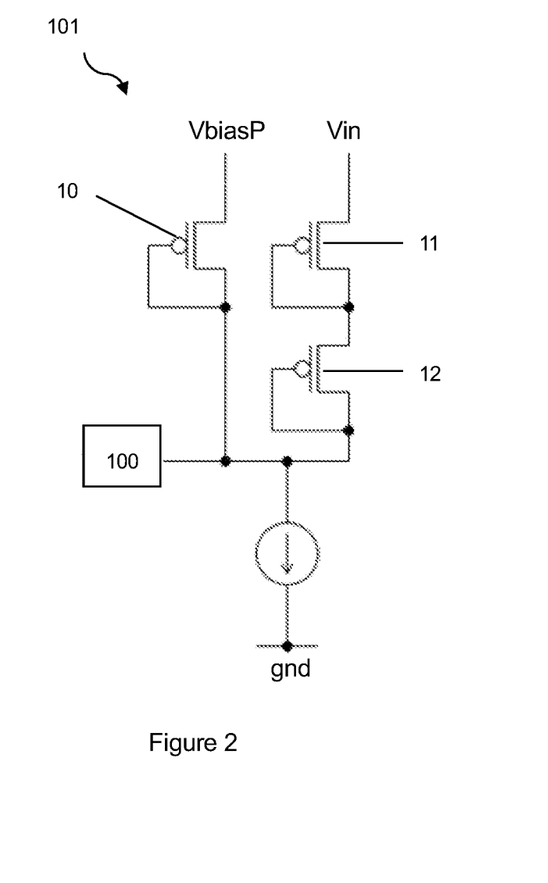
FIG. 2 illustrates a p-channel bias circuit in accordance with an embodiment of the present invention.

Referring to FIG. 2, the p-channel bias circuit (101) comprises a first bias transistor (10), a second bias transistor (11) and a third bias transistor (12). The first bias transistor (10), the second bias transistor (11) and the third bias transistor (12) can serve as PMOS transistors. A first source-drain terminal of the first bias transistor (10) can be connected to a p-channel biasing line whilst a second source-drain terminal and a gate terminal of the first bias transistor (10) can be commonly joined. The p-channel biasing line can serve as a positive voltage supply line and provide a p-channel biasing voltage VbiasP. The p-channel biasing voltage VbiasP can be arranged to be equal to Vdd minus Vnom, where Vdd is a reference high voltage which is also a positive I/O power supply voltage while Vnom is a nominal receiver voltage. The second source-drain terminal of the first bias transistor (10) can be further connected to a current source and subsequently a ground line. Accordingly, a voltage of VbiasP minus Vth, where Vth is equal to the threshold voltage of the first bias transistor (10), can be obtained.

Further, a second source-drain terminal and a gate terminal of the second bias transistor (11) can be commonly joined. Similarly, a second source-drain terminal and a gate terminal of the third bias transistor (12) can be commonly joined. Thereafter, the second bias transistor (11) and the third bias transistor (12) can be connected in series between the input means (3) and the current source which lies before the ground line. Accordingly, a voltage of Vin minus 2Vth, where 2Vth is equal to the sum of the threshold voltages of the second bias transistor (11) and the third bias transistor (12), can be obtained. Subsequently, the p-channel bias circuit (101) as shown in FIG. 2 may provide the p-channel bias voltage comprising a lowered voltage between the voltage of VbiasP minus Vth and the voltage of Vin minus 2Vth to the p-channel clamping transistor (6).

Figure 3:
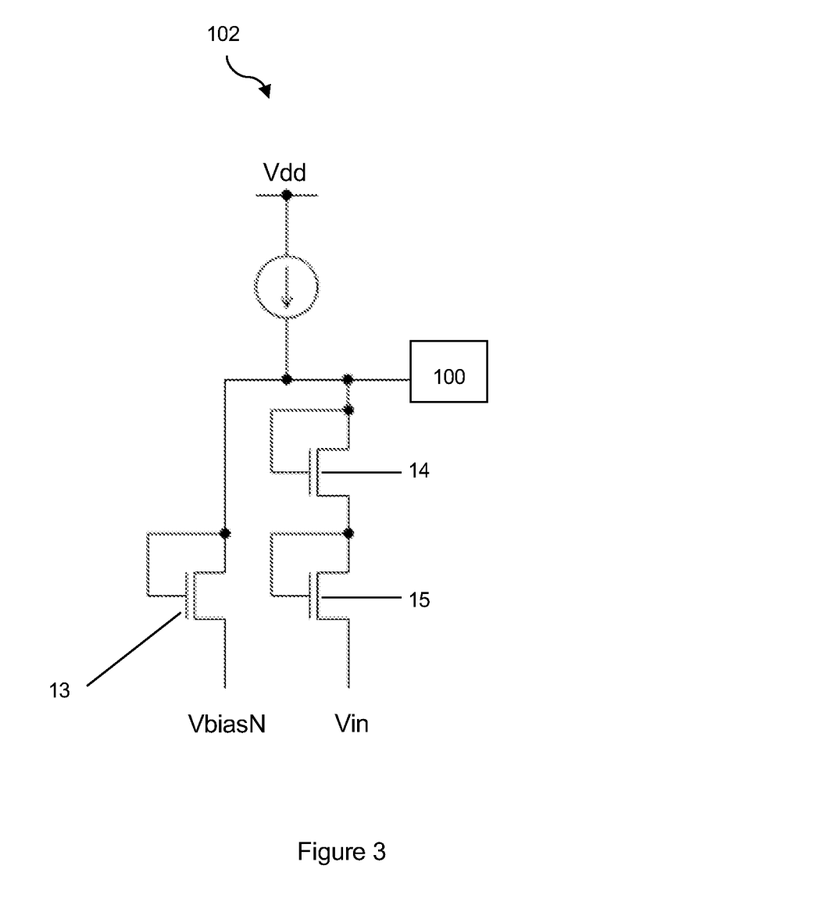
FIG. 3 illustrates an n-channel bias circuit in accordance with an embodiment of the present invention.

Referring to FIG. 3, the n-channel bias circuit (102) comprises a fourth bias transistor (13), a fifth bias transistor (14) and a sixth bias transistor (15). The fourth bias transistor (13), the fifth bias transistor (14) and the sixth bias transistor (15) can serve as NMOS transistors. A first source-drain terminal of the fourth bias transistor (13) can be connected to an n-channel biasing line whilst a second source-drain terminal and a gate terminal of the fourth bias transistor (13) can be commonly joined. The n-channel biasing line can serve as a positive voltage supply line and provide an n-channel biasing voltage VbiasN. VbiasN can be arranged to be equal to Vnom. The second source-drain terminal of the fourth bias transistor (13) can be further connected to the current source and subsequently the reference high voltage Vdd. Accordingly, a voltage of VbiasN plus Vth, where Vth is equal to the threshold voltage of the fourth bias transistor (13), can be obtained.

Further, a second source-drain terminal and a gate terminal of the fifth bias transistor (14) can be commonly joined. Similarly, a second source-drain terminal and a gate terminal of the sixth bias transistor (15) can be commonly joined. Thereafter, the fifth bias transistor (14) and the sixth bias transistor (15) can be connected in series between the input means (3) and the current source which lies before the reference high voltage Vdd. Accordingly, a voltage of Vin plus 2Vth, where 2Vth is equal to the sum of the threshold voltages of the fifth bias transistor (14) and the sixth bias transistor (15), can be obtained. Subsequently, the n-channel bias circuit (102) as shown in FIG. 3 may provide the n-channel bias voltage comprising a raised voltage between the voltage of VbiasN plus Vth and the voltage of Vin plus 2Vth to the n-channel clamping transistor (7).

Referring to FIGS. 1 and 2, the input voltage Vin can be split into two corresponding signals VsigP and VsigN. The dynamically generated bias voltage from the p-channel bias circuit (101) can be used to bias the p-channel clamping transistor (6) for preventing VsigP from falling below VbiasP. The p-channel clamping transistor (6) is turned on as soon as Vin rises one Vth above the lowered voltage between the voltage of VbiasP minus Vth and the voltage of Vin minus 2Vth. Arranged in this configuration, the p-channel clamping transistor (6) will switch on for the entire range from VbiasP to Vdd and offer a wide passing voltage range.

Referring to FIGS. 1 and 3, the dynamically generated bias voltage from the n-channel bias circuit (102) can be used to bias the n-channel clamping transistor (7) to prevent VsigN from rising above VbiasN. The n-channel clamping transistor (7) is turned on as soon as Vin falls one Vth below the raised voltage between the voltage of VbiasN plus Vth and the voltage of Vin plus 2Vth. Arranged in this configuration, the n-channel clamping transistor (7) will switch on for the entire range from ground voltage to VbiasN and offer a wide passing voltage range.

Figure 4:
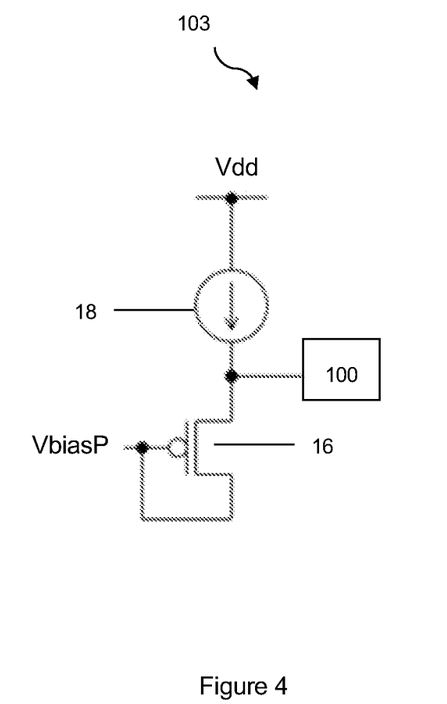
FIG. 4 illustrates a first control circuit in accordance with an embodiment of the present invention.

In accordance with the voltage clamping circuit (100) as shown in FIG. 1, the p-channel keeping transistor (8) can have a first source-drain terminal coupled to the first output node (4), a gate terminal connected to the input means (3), and a second source-drain terminal coupled to a first control circuit (103) as shown in FIG. 4 for obtaining a first control signal.

Figure 5:
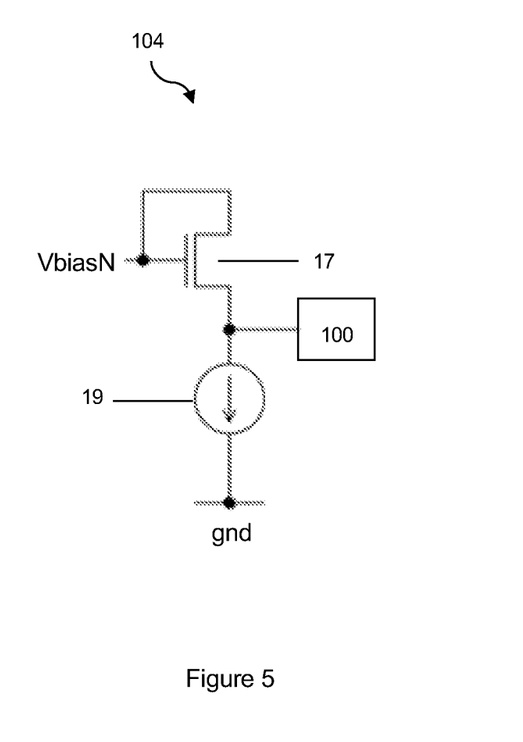
FIG. 5 illustrates a second control circuit in accordance with an embodiment of the present invention.

Similarly, the n-channel keeping transistor (9) can have a first source-drain terminal coupled to the second output node (5), a gate terminal connected to the input means (3), and a second source-drain terminal coupled to a second control circuit (104) as shown in FIG. 5 for obtaining a second control signal.

Referring to FIG. 4, the first control circuit (103) can provide a first control bias signal to turn on the p-channel keeping transistor (8). The first control circuit (103) comprises a first control transistor (16). The first control transistor (16) can serve as a PMOS transistor. A first source-drain terminal and a gate terminal of the first control transistor (16) can be commonly joined and further connected to the p-channel biasing line. A second source-drain terminal of the first control transistor (16) can be connected to a first current source (18) and subsequently the reference high voltage Vdd. Accordingly, the first control bias signal comprising a voltage of Vth plus VbiasP, where Vth is the threshold voltage of the first control transistor (16), is obtained. When Vin is less than VbiasP, the p-channel keeping transistor (8) can be turned on by the first control bias signal which is generated by the first control circuit (103). Connected in this way, the p-channel keeping transistor (8) can be enabled at the point when the p-channel clamping transistor (6) begins to turn off. As a result, the p-channel keeping transistor (8) ensures that the minimum voltage of VsigP is equal to VbiasP and thus there is no high-impedance state at the first output node (4). Subsequently, VsigP can be directed to the first receiver pad. In addition, the first current source (18) can function as a limiter of leakage current for the voltage clamping circuit (100). For example, the leakage current through the p-channel bias circuit (101) can be limited to the current value of the first current source (18).

Referring to FIG. 5, the second control circuit (104) can provide a second control bias signal to turn on the n-channel keeping transistor (9). The second control circuit (104) comprises a second control transistor (17). The second control transistor (17) can serve as an NMOS transistor. A first source-drain terminal and a gate terminal of the second control transistor (17) can be commonly joined and further connected to the n-channel biasing line. A second source-drain terminal of the second control transistor (17) can be connected to a second current source (19) and subsequently the ground line. Accordingly, the second control bias signal comprising a voltage of VbiasN minus Vth, where Vth is the threshold voltage of the second control transistor (17), is obtained. When Vin is greater than VbiasN, the n-channel keeping transistor (9) can be turned on by the second control bias signal which is generated by the second control circuit (104). Connected in this way, the n-channel keeping transistor (9) can be enabled at the point when the n-channel clamping transistor (7) begins to turn off. As a result, the n-channel keeping transistor (9) ensures that the maximum voltage of VsigN is equal to VbiasN and thus there is no high-impedance state at the second output node (5). Subsequently, VsigN can be directed to the second receiver pad. In addition, the second current source (19) can function as a limiter of leakage current for the voltage clamping circuit (100). For example, the leakage current through the n-channel bias circuit (102) can be limited to the current value of the second current source (19).

Figure 6A:
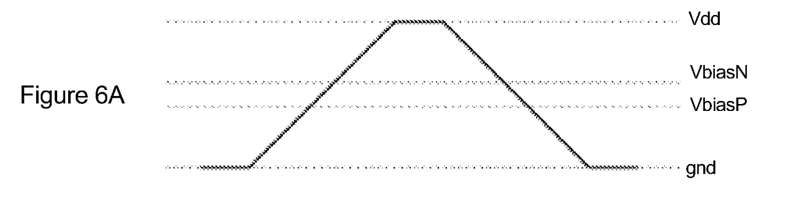
FIG. 6A illustrates a signal waveform of an input voltage in accordance with an embodiment of the present invention.
Figure 6B:
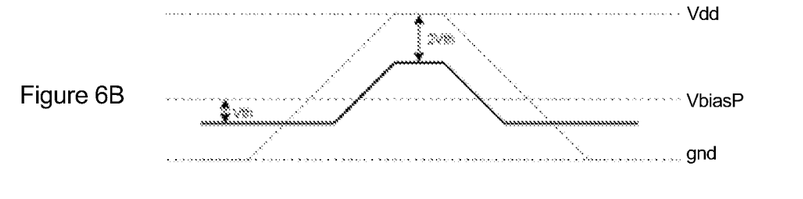
FIG. 6B illustrates a signal waveform of the p-channel bias voltage from the p-channel bias circuit of FIG. 2.
Figure 6C:
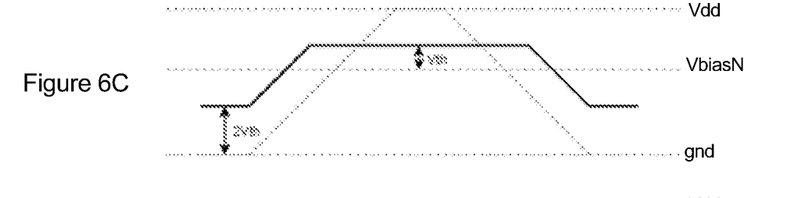
FIG. 6C illustrates a signal waveform of the n-channel bias voltage from the n-channel bias circuit of FIG. 3.
Figure 6D:
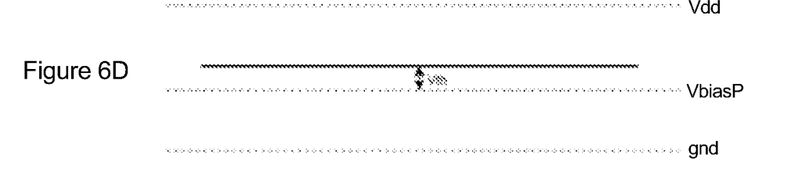
FIG. 6D illustrates a signal waveform of the first control bias signal from the first control circuit of FIG. 4.
Figure 6E:
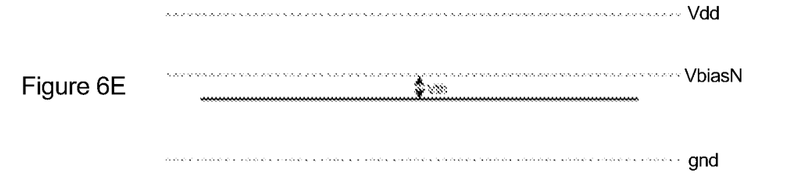
FIG. 6E illustrates a signal waveform of the second control bias signal from the second control circuit of FIG. 5.
Figure 6F:
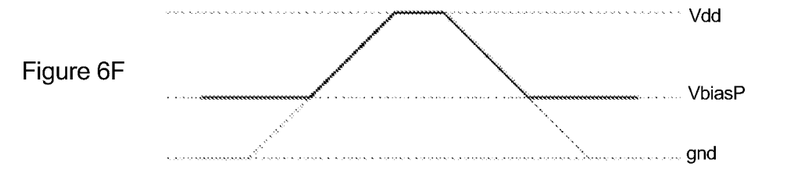
FIG. 6F illustrates a signal waveform of an output voltage in accordance with an embodiment of the present invention.
Figure 6G:
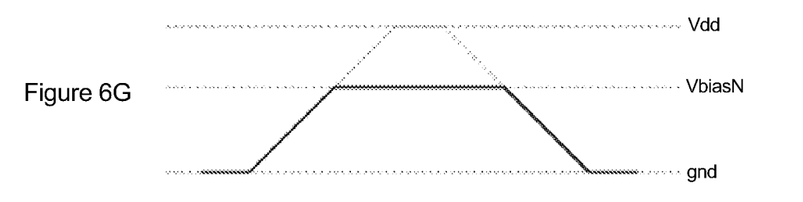
FIG. 6G illustrates a signal waveform of another output voltage in accordance with an embodiment of the present invention.

FIG. 6A illustrates a signal waveform of an input voltage in accordance with an embodiment of the present invention. The input voltage arriving at the I/O pad (2) can swing between Vdd and ground voltage. FIG. 6B illustrates a signal waveform of the p-channel bias voltage from the p-channel bias circuit (101) of FIG. 2. The p-channel bias voltage may swing between the voltage of Vdd minus 2Vth and the voltage of VbiasP minus Vth. FIG. 6C illustrates a signal waveform of the n-channel bias voltage from the n-channel bias circuit (102) of FIG. 3. The n-channel bias voltage may swing between the voltage of VbiasN plus Vth and the voltage of ground voltage plus 2Vth. FIG. 6D illustrates a signal waveform of the first control bias signal from the first control circuit (103) of FIG. 4. The first control bias signal is constant at the voltage of Vth plus VbiasP. FIG. 6E illustrates a signal waveform of the second control bias signal from the second control circuit (104) of FIG. 5. The second control bias signal is constant at the voltage of VbiasN minus Vth. FIG. 6F illustrates a signal waveform of VsigP in accordance with an embodiment of the present invention. VsigP may swing between Vdd and VbiasP. FIG. 6G illustrates a signal waveform of VsigN in accordance with an embodiment of the present invention. VsigN may swing between VbiasN and ground voltage.

The present invention also relates to a method for operating the voltage clamping circuit (100). The method comprises the steps of receiving the input voltage Vin, generating the p-channel bias voltage, generating the n-channel bias voltage, controlling the p-channel clamping transistor (6) based on the input voltage and the p-channel bias voltage, controlling the n-channel clamping transistor (7) based on the input voltage and the n-channel bias voltage, turning on the p-channel clamping transistor (6) when the input voltage Vin rises above the p-channel biasing voltage VbiasP, turning on the n-channel clamping transistor (7) when the input voltage falls below the n-channel biasing voltage VbiasN, and providing the first output voltage from the p-channel clamping transistor (6) and the second output voltage from the n-channel clamping transistor (7).

In accordance with an embodiment of the present invention, the method for operating the voltage clamping circuit (100) further comprises the steps of keeping the first output voltage when the p-channel clamping transistor (6) begins to turn off and keeping the second output voltage when the n-channel clamping transistor (7) begins to turn off.

In accordance with an embodiment of the present invention, the p-channel keeping transistor (8) can be turned on by the first control circuit (103) and the n-channel keeping transistor (9) can be turned on by the second control circuit (104).

By applying voltage clamping with dynamic bias, the voltage clamping circuit (100) is capable of offering a wide passing voltage range. Further, the wide passing voltage range is process-independent and thus signal attenuation that normally arises owing to process variation is minimized in the voltage clamping circuit (100). In addition, by implementing voltage keeping, the voltage clamping circuit (100) is capable of eliminating the high-impedance state for the outputs of the voltage clamping circuit (100) across the entire range from Vdd to ground voltage.

Various modifications to these embodiments are apparent to those skilled in the art from the description and the accompanying drawings. The principles associated with the various embodiments described herein may be applied to other embodiments. Therefore, the description is not intended to be limited to the embodiments shown along with the accompanying drawings but is to be providing broadest scope of consistent with the principles and the novel and inventive features disclosed or suggested herein. Accordingly, the invention is anticipated to hold on to all other such alternatives, modifications, and variations that fall within the scope of the present invention and appended claim.

In the claims which follow and in the preceding description of the invention, except where the context requires otherwise due to express language or necessary implication, the word "comprise" or variations such as "comprises" or "comprising" is used in an inclusive sense, i.e. to specify the presence of the stated features but not to preclude the presence or addition of further features in various embodiments of the invention.

The invention claimed is:

1. A voltage clamping circuit for protecting an internal circuitry comprising:
   an input means for receiving an input voltage Vin;
   a p-channel clamping transistor coupled to the input means for clamping the input voltage to prevent the input voltage from falling below a p-channel biasing voltage VbiasP;
   an n-channel clamping transistor coupled to the input means for clamping the input voltage to prevent the input voltage from rising above an n-channel biasing voltage VbiasN; and
   a plurality of output means for providing a first output voltage from the p-channel clamping transistor and a second output voltage from the n-channel clamping transistor;

a p-channel bias circuit including a first bias transistor, a second bias transistor and a third bias transistor with each transistor possessing a threshold voltage Vth for providing a p-channel bias voltage to turn on the p-channel clamping transistor; and an n-channel bias circuit including a fourth bias transistor, a fifth bias transistor and a sixth bias transistor with each transistor possessing the threshold voltage Vth for providing an n-channel bias voltage to turn on the n-channel clamping transistor;

wherein the first bias transistor is connected to a p-channel biasing line associated with the p-channel biasing voltage VbiasP; the second bias transistor and the third bias transistor are connected in series and to the input means;

wherein the fourth bias transistor is connected to an n-channel biasing line associated with the n-channel biasing voltage VbiasN; the fifth bias transistor and the sixth bias transistor are connected in series and to the input means, wherein the voltage clamping circuit further comprises:

a p-channel keeping transistor coupled to the p-channel clamping transistor for keeping the first output voltage when the p-channel clamping transistor begins to turn off;

an n-channel keeping transistor coupled to the n-channel clamping transistor for keeping the second output voltage when the n-channel clamping transistor begins to turn off;

a first control circuit for turning on the p-channel keeping transistor; and a second control circuit for turning on the n-channel keeping transistor, wherein the first control circuit comprises a first current source configured to limit leakage current of the p-channel clamping transistor and the second control circuit comprises a second current source configured to limit leakage current of the n-channel clamping transistor.

2. The voltage clamping circuit as claimed in claim 1, wherein the p-channel clamping transistor is a p-type metal-oxide-semiconductor device and the n-channel clamping transistor is an n-type metal-oxide-semiconductor device.

3. The voltage clamping circuit as claimed in claim 1, wherein the first bias transistor, the second bias transistor and the third bias transistor are further connected to a ground line.

4. The voltage clamping circuit as claimed in claim 1, wherein the fourth bias transistor, the fifth bias transistor and the sixth bias transistor are further connected to a reference high voltage Vdd.

* * * * *